United States Patent [19]

Lee et al.

[11] Patent Number: 4,942,207

[45] Date of Patent: Jul. 17, 1990

[54] PROCESS FOR THE PREPARATION OF MODIFIED RESIN USEFUL AS A LOW-STRESS SEMICONDUCTOR ENCAPSULANT AND COMPOSITION FORMED THEREFROM

[75] Inventors: Jung D. Lee; Chang J. Yoo; Moon Y. Lee, all of Suwon, Rep. of Korea

[73] Assignee: Korea Chemical Co., Ltd., Kyungsangnam, Rep. of Korea

[21] Appl. No.: 384,093

[22] Filed: Jul. 24, 1989

Related U.S. Application Data

[63] Continuation of Ser. No. 160,347, Feb. 25, 1988, abandoned.

[30] Foreign Application Priority Data

Oct. 31, 1987 [KR] Rep. of Korea .................... 87-12192

[51] Int. Cl.$^5$ ............................................ C08F 283/00
[52] U.S. Cl. .................................... 525/476; 525/102; 525/105; 525/403; 525/474
[58] Field of Search ............... 525/102, 105, 474, 476, 525/403

[56] References Cited

U.S. PATENT DOCUMENTS 4,251,426 2/1981 McClure et al. .................... 525/476
4,287,326 9/1981 Mikami .............................. 525/476
4,749,764 6/1988 Koerner et al. ..................... 525/474

*Primary Examiner*—Melvin I. Marquis
*Attorney, Agent, or Firm*—Birch, Stewart, Kolasch & Birch

[57] ABSTRACT

A suspension or emulsion polymerization process for the preparation of modified resin useful as a low-stress semiconductor encapsulant which comprises reacting a silicone oil or a silicone resin an having at least two silanol groups or hydrolyzable alkoxy groups with a silane coupling agent having at least two hydrolyzable alkoxy groups to form a suspension or emulsion of a reactive intermediate product, azeotropically distilling the resulting suspension or emulsion to produce a distrilled intermediate product, and adding an epoxy resin or a phenol resin to the distilled intermediate product to produce a matrix having insoluble and infusible spherical particles.

13 Claims, 2 Drawing Sheets

PROCESS FOR THE PREPARATION OF MODIFIED RESIN USEFUL AS A LOW-STRESS SEMICONDUCTOR ENCAPSULANT AND COMPOSITION FORMED THEREFROM

This application is a continuation of application Ser. No. 07/160,347 filed on Feb. 25, 1988, now abandoned.

BACKGROUND OF THE INVENTION

1. Field of the Invention

The present invention relates to a process for preparing a modified resin useful as a low-stress semiconductor encapsulant for improving the reliability of material used in semiconductor encapsulation by utilizing a molding process and the like, as well as to a modified resin composition produced therefrom.

2. Description of the Prior Art

Molding compounds useful for semiconductor encapsulation of large-scale semiconductor devices, large size chips, and small size memory cells have been developed for improving moisture resistance, lowering stress, and reducing radiation of alpha particles thereof. However, such molding compounds suffer from a number of problems. For example, it is very difficult for a semiconductor encapsulant made of a thermosetting resin, such as an epoxy resin, to exhibit a minimized volume-change during the molding process, a minimized linear thermal-expansion coefficient when compared with the coefficient of enclosed metal parts, or a desired compatibility with the other components. Further, the resin usually lacks desired thermal resistance, moisture resistance, and crack resistance, and insufficiently protects semiconductor parts and the wire bonds therewithin from internal shock and the external environment.

Generally, an epoxy resin is used as a thermosetting resin since it has many desired electrical and mechanical properties, and exhibits chemical resistance. However, it exhibits undesired flexibility after curing so that an elastic rubber or the like is added to the epoxy resin by blending or reacting the rubber with the epoxy resin to overcome this problem.

In spite of this, the resulting blend exhibits many defects such as, for example, a larger thermal-expansion rate and a reduced flowing property when the rubber is added alone to the epoxy resin. Also a tacky or stained curing surface results due to the curability difference, as well as reduced molding time.

In another method, a silicone oil or silicone resin intermediate is simply added to the epoxy resin or a phenol resin for reducing the linear-expansion coefficient when compared with the inorganic material. However, many problems arise such as, for example, non-uniform dispersion conditions due to an incompatibility with the other composition parts, a reduction in strength of the cured product, and a reduction in bondability with the metal parts, whereby the reliability of the resulting semiconductor device is greatly reduced.

A method for producing an addition product of a coupling agent and an inorganic filler is already known. This method is used to improve moisture resistance and to reinforce strength. However, it is unsatisfactory with respect to absorbing and reducing the stress caused by increased modulus, and also, if an excess amount of coupling agent is used, a stain appears since the absorbtion capability is limited and some of the remaining coupling agent reacts with organic binders which causes voids to be formed during the molding process.

SUMMARY OF THE INVENTION

Accordingly, it is an object of the present invention to provide a process for preparing a modified resin useful as a low-stress encapsulant of semiconductor devices which has a high reliability by the reaction of silicone oil or silicone resin having silanol groups or alkoxy groups with a coupling agent in a suspension or emulsion polymerization process in order to form a first intermediate product which is then azeotropically distilled to recover a granular reactive intermediate product. Thereafter, the granular reactive intermediate is reacted with an epoxy resin or phenolic resin for uniform dispersion in a matrix of an addition product. Then reacting the resulting addition product with a rubber compound in liquid form which has organic functional groups to form the final product.

It is still another object of the present invention to provide a modified resin composition useful as a semiconductor encapsulant which protects against stress.

A further object of the present invention is to provide a modified resin which has an improved bondability with the epoxy resin composition, exhibits a uniform dispersion in a matrix, and is a low-stress encapsulant.

Another object of the present invention is to provide a semiconductor encapsulant which absorbs and disperses the various internal and external shocks applied to higher integrated semiconductor devices with high reliability.

Still a further object of the present invention is to produce an encapsulated semiconductor which exhibits increased strength and has higher reliability which can be prepared with low modulus, enhanced compatibility, and increased moisture resistance.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Figure 1:
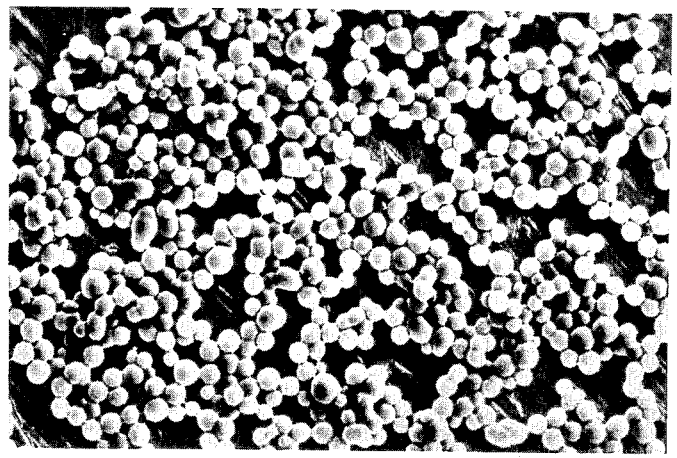
FIGS. 1 and 2 are enlarged perspective views of globular particles produced by the reaction between an intermediate product and an epoxy resin in accordance with the present invention.

The modified resin useful as a semiconductor encapsulant according to the present invention is prepared by the following process.

A semiconductor encapsulation material according to the present invention is prepared by adding a silicone oil or a silicone resin having thermal resistance, a low linear expansion rate, and a low modulus property to an epoxy resin or a phenolic resin.

The resulting addition product when used as a semiconductor encapsulant, disperses and absorbs external shock, and provides for bonding with surrounding organic binders for proper dispersion in a semiconductor molding compound.

Another embodiment of the process according to the present invention comprises adding the addition product to a reactive rubber in a liquid to form a structure of an interpenetrating polymer network (IPN) in a polymer matrix after final curing which exists as insoluble and infusible spherical particles that are linked to each other within the matrix and are properly dispersed.

More specifically, the present invention comprises the following four steps. In the first step, a silicone oil or silicone resin having two or more silanol groups (Si—OH) or hydrolyzable alkoxy groups is reacted with a silane coupling agent having organic functional groups and hydrolyzable alkoxy groups to produce a suspension or emulsion of polymerized particles.

In a second step, azeotropic distillation is conducted to remove water from the resulting suspension or emulsion intermediate product.

In a third step, the distilled intermediate product is reacted with an epoxy resin or phenol resin to produce an addition product.

In a fourth step, the addition product is reacted with having organic functional groups to produce a final product having an interpenetrating polymer network (IPN) structure therewithin.

In the first step, about 80 to 100 parts by weight of silicone oil or silicone resin and about 5 to 20 parts by weight of the silane coupling agent are dispersed into about 300 to 500 parts by weight of distilled water. An hydrolysis of the hydrolyzable alkoxy groups is conducted at a temperature of about 40° to 60° C. for about 2 to 4 hours with stirring so as to form silanol groups. At this time, a further reaction is conducted at a temperature of about 60° to 95° C. for about 5 to 10 hours to produce a granular reactive intermediate product.

In order to promote the hydrolysis of the alkoxy group in the first step, the pH of the distilled water is regulated as follows; for example, when the organic groups of the silane coupling agent include an epoxy group or a mercapto group, the pH value may be adjusted to about 3 to 4 by using oxalic acid, acetic acid or formic acid and, when the organic groups of the silane coupling agent include an amino group, the pH value may be adjusted to about 11 to 12 by using aqueous ammonia.

In the first step, the silicone and the coupling agent are hydrolyzed, and the silanol groups are co-condensated with each other to produce fine particles in a suspension or emulsion.

In the co-condensation reaction, the silanol groups are not completely converted. Therefore, it is necessary to conduct azeotropical distillation in the second step to completely remove the silanol groups.

The suspension or condensation product in the emulsion polymerization contains fine particles, which contain siloxane bonds formed by the co-condensation of the hydrolyzed silanol groups and intramolecular silanol groups.

In the second step, the siloxane bonds can be proportionately increased when the reaction temperature is increased, or the heating period is lengthened.

If a silane coupling agent having amine groups is used as an emulsifier during emulsion polymerization, any additional emulsifier is not needed.

However, if the silane coupling agent not having amine groups is used, an emulsifier such as a sorbitan trioleate, polyethylene glycol monoleate, octyl benzene sulphonic acid, alkyl aryl sulphonic acid, or the like can be used.

The silicone oil used has two or more silanol groups or hydrolyzable alkoxy groups, such as for example, alcohol modified silicone oils, alcohol and alkoxy group co-modified silicone oils, and alkoxy-modified silicone oils can preferably be used. The silicone resin having two or more silanol groups or alkoxy groups, such as for example, resins having silanol functional groups, alkoxy functional groups, and both silanol and alkoxy functional groups can be used as a starting material according to the present invention.

Besides the above noted silicone resins, the starting material may have two or more silanol or hydrolyzable alkoxy functional groups and phenyl groups, phenyl ether groups, methyl groups, and a small number of hydrogen atoms in addition to silanol groups and/or alkoxy groups.

The silicone compounds, silicone oils and/or silicone resins used in the present invention should have a molecular weight of about 1,000 to 6,000.

Suitable silicone resins include, for example, TMSH 6018 and TMA1-3037 from Toray Silicone Co.; TMDC 3037, TMZ 6018, and TMZ 6188 from Dow Corning Co.; and TMCPR 6163 from Dynamite Noble Chemical Co., etc.

As a suitable coupling agent, a silane coupling agent having two or more hydrolyzable alkoxy groups may be used, such as $\beta$-(3,4-epoxycyclohexyl) ethyl trimethoxy silane, $\alpha$-glycyloxy propyl trimethoxy silane, $\alpha$-mercaptopropyl trimethoxy silane, $\alpha$-amino propyl trimethoxy silane, N-$\beta$-(amino ethyl) - $\alpha$ - amino propyl trimethoxy silane and amino modified methoxy silane.

In the second step, i.e. the azeotropic distillation step, it is preferred that an organic solvent be used, such as benzene, toluene, xylene, methyl ethyl ketone, methyl isopropyl ketone, and methyl isobutyl ketone, etc. for removing the water from the initial reactive mixture. During the azeotropic distillation, the water and alcohol are removed from the boiling mass of the azeotropic mixture with the organic solvent.

The resultant vapors from the second step are condensed to form the organic solvent and the produced solvent is recycled. If the reflux temperature is maintained for 1 to 2 hours, siloxane bonding is increased so that the resulting solid is about 40 to 60% by weight.

After the azeotropic distillation step, the granular reactive intermediate has few silanol groups but many organic functional groups from the coupling agent so that it may readily bond with the epoxy resin or phenolic resin in the third reaction step and properly disperse in the matrix.

In the third step, about 70 to 90 parts by weight of the epoxy resin or the phenolic resin react with the solid produced from the second step at the temperature of about 140° to 150° C. for about 2 to 3 hours to form an addition product.

When the organic groups of the reactive intermediate are amino groups or mercapto groups, the epoxy resin is used, whereas, when the organic groups are epoxy groups, the phenolic resin is used.

Figure 2:
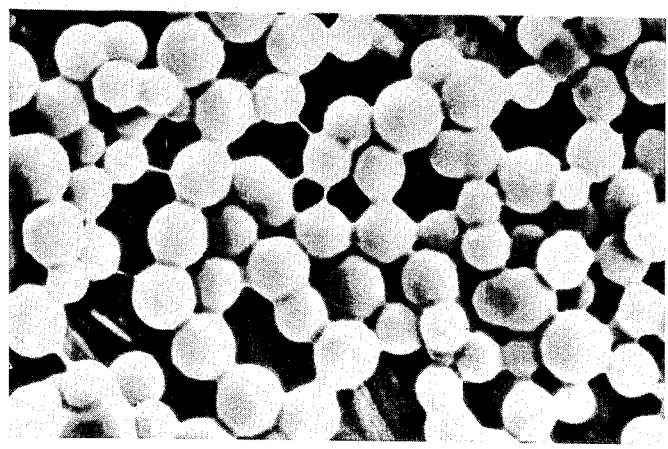
Figure 3:
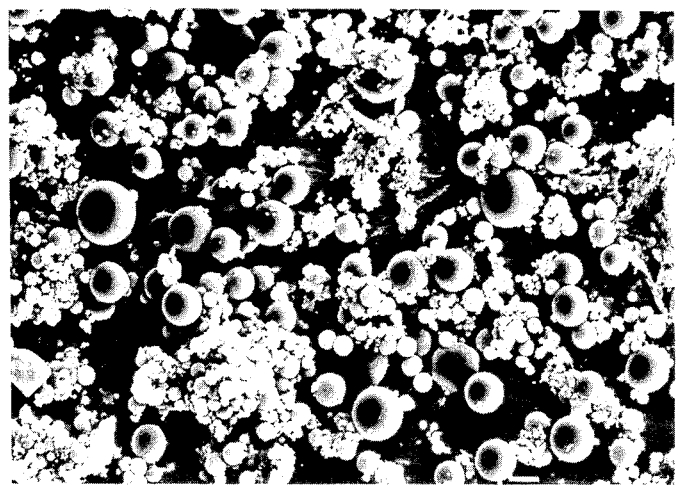
FIGS. 3 and 4 are enlarged perspective views of globular particles of an intermediate product produced in accordance with the present invention.
Figure 4:
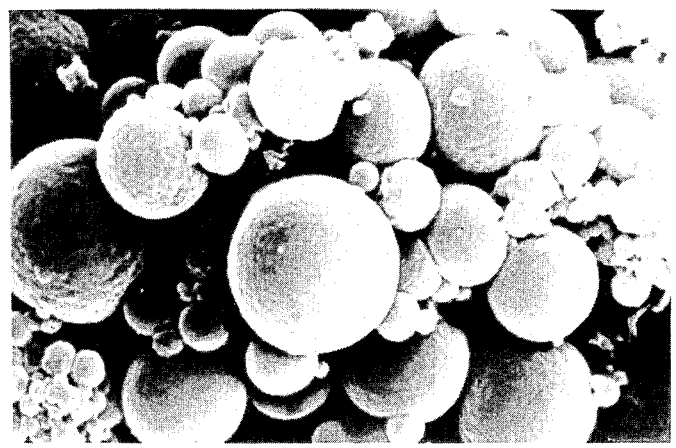

In the third reaction step, the organic solvent is completely removed by stirring a low pressure of about 50 mmHg for about 1 hour. The spherical particles produced from the third reactive intermediate, as shown in FIGS. 1 and 2, have insoluble and infusible properties, are about 0.1 to 50 μm in particle size, and are about 5 to 20 parts based on 100 parts of the total modified resin.

The present invention further relates to the following fourth step to improve and satisfy the required property as a semiconductor encapsulation material.

In the fourth step, a liquid rubber having organic functional groups is added to the resulting product of the third step and the resulting reaction forms an interpenetrating polymer network (IPN) in a polymer matrix after curing.

It is preferred that the reactive liquid rubber intermediate be in an amount of about 10 to 20 parts in ratio to about 80 to 90 parts of the third step addition product at a temperature of about 110° to 150° C. using a nitrogen atmosphere for about 2 to 3 hours.

A liquid rubber having the carboxylic groups or amine groups is preferred when the epoxy resin is used in the third step, and a liquid rubber having epoxy groups is preferred when a phenolic resin is used. A liquid rubber having one to three organic functional groups and a molecular weight of about 2,000 to 4,000 can be used, such as those classified into cis-and trans-type butadiene rubbers, acrylonitrile-butadiene copolymer rubbers, isoprene rubbers, and the like, as well as other rubber compounds.

The epoxy resin used in the third reaction step is preferred to have a bisphenol A-type epoxy resin, phenol novolac epoxy resin, cresol novolac epoxy resin, and the like. A bisphenol A type epoxy resin in liquid form has an epoxy equivalent weight of about 180 to 205 and a bisphenol A type epoxy resin in solid form has an epoxy equivalent weight of about 400 to 550 and a softening point of about 70° to 90° C.

The phenolic novolac epoxy resin is preferably phenol novolac epoxy resin in liquid form, which has an epoxy equivalent weight about 70 to 190 and in solid form has an epoxy equivalent weight of about 180 to 220 and a softening point of about 60° to 85° C.

The phenol resin includes a novolac phenol resin or a cresol novolac phenol resin. The novolac phenol resin is preferred to have a softening point of about 70° to 100° C. The cresol novolac phenol resin has an hydroxy value of about 105 to 120 and a softening point of about 70° to 90° C.

The third step product according to the present invention may be used as a modified resin for the semiconductor devices.

The final product obtained from the fourth step may be added to known epoxy molding compounds as a modified resin useful as a semiconductor encapsulant for improving buffer impact, reducing thermal-expansion coefficient differences, and lowering modulus so that the final product provides for semiconductor parts exhibiting higher reliability. The combination ratio of known epoxy molding compounds to the modified resin produced from the third step of the process of the present invention approximately 5 to 10 parts by weight and to the modified resin produced from the fourth step, 5 to 15 parts by weight.

The present invention will now be described in more detail in connection with the following examples which should be considered as being exemplary and not limiting the present invention.

EXAMPLE 1

80 parts of silicon oil such as SF 8428 from Toray Silicone Co., and 10 parts of α- amino propyl trimethoxy silane is added into 300 parts of distilled water. The initial mixture is heated with stirring for 8 hours, and thereafter, 300 parts of methyl isobutyl ketone is added to the mixture. The mixture is azeotropically distilled under reflux to remove water from the reaction step completely and is maintained at a temperature of about 115° C. for 1 hour. Subsequently, 420 parts of the cresol novolac epoxy resin having epoxy equivalent of 198 is added into the mixture at a temperature of 150° C. for 2 hours and the solvent is removed from the mixture at a pressure of 50 mmHg.

90 parts of butadiene-acrylonitrile rubber such as Hycar CTBN 1300×8 from Goodrich Co. is added to the resulting product at 150° C. and the mixture reacted continuously until that the acid value is reduced to not more than 0.1, and thereby the desired modified resin is obtained.

EXAMPLE 2

100 parts of alcohol modified silicone oil having an hydroxy value of 800, viscosity of 310 (at 25° C.), and specific gravity of 1.07, 15 parts of α- glycyloxy propyl triepoxy silane, and 6 parts of octyl benzene sulfonic acid is added to 300 parts of distilled water. The mixture is hydrolyzed by heating at 60° C. for 2 hours with stirring and then is reacted by heating at 90° C. for 6 hours with stirring.

Azeotropic distillation is carried out at a reflux temperature (about 115° C.) by using 300 parts of xylene to remove water and additional reaction follows for 2 hours. Thereafter 530 parts of novolac phenol resin having an hydroxy value of 106 is added and then the solvent is removed completely at 50 mmHg for further reaction at 140° C. for 3 hours. After the reaction 100 parts of butadiene rubber such as Poly bd R-45 EPT from Idemitsu Petrochemical Co., Ltd. is added and reacted at 140° C. for 3 hours and thereby the desired modified resin is obtained.

EXAMPLE 3

A modified resin is prepared by the method and composition according to EXAMPLE 1 except that 420 parts of cresol novolac epoxy resin is used and the butadiene acrylonitrile rubber is not used.

EXAMPLE 4

The modified resin is prepared by the method and composition according to EXAMPLE 2 except that 450 parts of novolac phenol resin is used and butadiene-acrylonitrile rubber is not used.

COMPARATIVE EXAMPLE 1

20 parts of methoxy reactive silicone resin intermediate having an ash content of 86.6% by weight and methoxy content of 18% by weight, 80 parts of epoxy resin and 2 parts of benzoic acid are mixed and reacted as in EXAMPLE 1 at 150° C. for 4 hours to obtain a product.

COMPARATIVE EXAMPLE 2

20 parts of amine modified silicone oil having amine groups at both ends of the molecule and having an amine value 826, and 80 parts of cresol novolac epoxy resin having an epoxy equivalent weight of 198 are mixed and reacted as in EXAMPLE 1 at 150° C. for 4 hours to obtain a product.

COMPARATIVE EXAMPLE 3

20 parts of butadiene-acrylonitrile rubber (same as that in EXAMPLE 1) and 80 parts of cresol novolac epoxy having an epoxy equivalent weight of 198 are reacted at 150° C. for 3 hours until the acid value is not more than 0.1 to obtain a product.

Each of the modified resins prepared in EXAMPLES 1, 2, 3, and 4, and COMPARATIVE EXAMPLES 1, 2, and 3 are formulated according to Table 1. The mixture is blended in two mill rolls, preheated at 80° C. for 3 minutes, allowed to cool and ground into granular form to prepare epoxy molding compounds for semiconductor encapsulation. The results of comparison tests using these compositions shown in Table 2.

TABLE 1

| Composition | 1 | 2 | 3 | 4 | 5 | 6 | 7 |
|---|---|---|---|---|---|---|---|
| Cresol novolac epoxy resin (1) | 7 | 15 | 7 | 15 | 7 | 7 | 7 |
| Phenol resin (2) | 10 | 2 | 10 | 2 | 10 | 10 | 10 |
| Undecyclic imidazole | 0.45 | 0.45 | 0.45 | 0.45 | 0.45 | 0.45 | 0.45 |
| Carnauba Wax | 0.3 | 0.3 | 0.3 | 0.3 | 0.3 | 0.3 | 0.3 |
| Hydrogenated caster oil | 0.15 | 0.15 | 0.15 | 0.15 | 0.15 | 0.15 | 0.15 |
| Acetylene black | 0.2 | 0.2 | 0.2 | 0.2 | 0.2 | 0.2 | 0.2 |
| Furnace black | 0.1 | 0.1 | 0.1 | 0.1 | 0.1 | 0.1 | 0.1 |
| Brominated epoxy resin | 3 | 3 | 3 | 3 | 3 | 3 | 3 |
| Antimony trioxide | 0.15 | 0.15 | 0.15 | 0.15 | 0.15 | 0.15 | 0.15 |
| r-Glycyloxy propyl triethoxy silane | 0.15 | 0.15 | 0.15 | 0.15 | 0.15 | 0.15 | 0.15 |
| Isopropyl trioctanonyl titanate | 2 | 2 | 2 | 2 | 2 | 2 | 2 |
| Red phosphorus | 62 | 62 | 62 | 62 | 62 | 62 | 62 |
| Calcium carbonate | 8 | 8 | 8 | 8 | 8 | 8 | 8 |
| Reaction product from the examples (Modified Resins according to the present invention) | Ex. 1 8 | Ex. 2 8 | Ex. 3 8 | Ex. 4 8 | — | — | — |
| Reaction products from the Comparative Examples | — | — | — | — | CEx. 1 8 | CEx. 2 8 | CEx. 2 8 |

Note:
(1) EOCN 1020, Product of Nippon KayaKu Co.
(2) HRJ 2717, Product of Schenectady Co.
(3) BRENS, product of Nippon KayaKu Co.
Abbreviation: Ex = Example, CEx = Comparative Example

TABLE 2

| Test Item | Sample No. | | | | | | |
|---|---|---|---|---|---|---|---|
| | 1 | 2 | 3 | 4 | 5 | 6 | 7 |
| Spiral flow (1) | 32 | 31 | 33 | 34 | 37 | 38 | 38 |
| Glass transition (2) temperature | 161 | 160 | 150 | 159 | 139 | 142 | 146 |
| Flexural (3) modulus (Kg/mm$^2$) | 950 | 900 | 1150 | 1100 | 1200 | 1100 | 1100 |
| Flexural (4) strength (Kg/mm$^2$) | 1100 | 1150 | 1050 | 1100 | 800 | 830 | 810 |
| Stress (Kg/mm$^2$) (5) | 0.3 | 0.25 | 0.41 | 0.38 | 0.83 | 0.85 | 0.91 |
| Moldability (6) (times) | 550 | 600 | 800 | 700 | 150 | 200 | 100 |

Note:
(1) Spiral flow: Measured on granular epoxy composition for semiconductor encapsulation at 170° C. × 70 KG/Cm$^2$ for 2 minutes according to the method of EMMI-1-66.
(2) Glass transition temperature: The temperature shown in the varying gradient of linear expansion slope.
(3) Measured according to JIS K 6911.
(4) Measured according to JIS K 6911.
(5) Measured on granular epoxy resin composition by steel ring method; strain gauge is fixed on the inner wall of steel ring having inner diameter of 2 cm, thickness of 1 mm and height of 2 cm. Outer wall of steel ring is molded with the thickness of 1 cm at 170° C. and pressure of 75 Kg/Cm$^2$. Then after cooling to ambient temperature of 25° C., the degree of deformation in steel ring is measure.
(6) Number of molding times capable of operation without cleaning when molding.

The granular composition for encapsulation material is transfer molded in 26-PIN DIP type IC frame having island size of 4×6 mm at 170° C. at pressure of 75 Kg/Cm$^2$, and then, is cured at 170° C. for 4 hours to obtain semiconductor parts. The results of samples compared for the thermal impact property are shown in Table 4.

TABLE 4

| | | Sample No. | | | | | | |
|---|---|---|---|---|---|---|---|---|
| | | 1 | 2 | 3 | 4 | 5 | 6 | 7 |
| (1) | 10 Times | 0 | 0 | 0 | 0 | 25 | 10 | 20 |
| | 50 Times | 5 | 10 | 7 | 8 | 100 | 40 | 50 |
| | 100 Times | 10 | 20 | 10 | 12 | 100 | 100 | 100 |
| (2) | 500 Times | 0 | 0 | 0 | 0 | 15 | 5 | 10 |
| | 1000 Times | 0 | 0 | 1 | 0 | 30 | 20 | 20 |
| | 2000 Times | 0 | 1 | 3 | 2 | 75 | 70 | 50 |
| (3) | 50 Times | 0 | 0 | 0 | 0 | 30 | 5 | 9 |
| | 100 Times | 1 | 0 | 0 | 1 | 100 | 30 | 50 |
| | 160 Times | 2 | 2 | 3 | 2 | — | 80 | 81 |
| | 200 Times | 3 | 7 | 10 | 8 | — | 100 | 100 |

Note:
(1) Thermal impact test. Sample is immersed in solutions of 196° C. and 210° C. alternately for 30 seconds each of time. The ratio of crack occurrence shows the number of chips which suffered cracks to the total of 50 IC chips by percentage.
(2) Pressure cooker test. Number of chips that the aluminum wire has been corroded among 100 chips at 121° C., relative humidity of 100%.
(3) Bias PCT: Number of chips that the aluminum wire has been corroded among 100 chips, in which the voltage of DC 20 is applied at 121° C., relative humidity of 100%.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A process for the preparation of a modified resin useful as a semiconductor encapsulant, which comprises the steps of:

reacting in a water medium a silicone oil or a silicone resin having at least two silanol groups or hydrolyzable alkoxy groups with a silane coupling agent having at least two hydrolyzable alkoxy groups to form an aqueous suspension of a reactive intermediate product, azeotropically distilling said suspension to form a distilled intermediate product after removing water or alcohol, and reacting with said distilled intermediate product (1) an epoxy resin being a chemical selected from the group consisting of a bisphenol A epoxy resin, a phenol novolac epoxy resin, and a cresol novolac epoxy resin or (2) a phenol resin being a chemical selected from the group consisting of a novolac phenol resin and a cresol novolac phenol resin to produce an addition product comprising insoluble and infusible spherical particles in a matrix.

2. The process of claim 1, wherein the silicone oil is an oil selected from the group consisting of an alcohol modified silicone oil, an alcohol and alkoxy co-modified silicone oil, and an alkoxy modified silicone oil.

3. The process of claim 1, wherein the silicone resin is a resin selected from the group consisting of reactive silanol intermediates and alkoxy intermediates, wherein the intermediate has a phenyl group, a phenylethermethyl group and a small number of hydrogen atoms, and wherein said silicone resin has at least two silanol groups or reactive alkoxy groups and a molecular weight of about 1,000 to 6,000.

4. A process for the preparation of a modified resin which comprises the steps of:

reacting in a water medium a silicone oil or a silicone resin having at least two silanol groups or hydrolyzable alkoxy groups with a silane coupling agent having at least two hydrolyzable alkoxy groups to form an aqueous suspension of a reactive intermediate product, azeotropically distilling said suspension to form a distilled intermediate product after removing water or alcohol, reacting with said distilled intermediate product (1) an epoxy resin being a chemical selected from the group consisting of a bisphenol A epoxy resin, a phenol novolac epoxy resin, and a cresol novolac epoxy resin or (2) a phenol resin being a chemical selected from the group Consisting of a novolac phenol resin and a cresol novolac phenol resin to produce an addition product comprising insoluble and infusible spherical particles in a matrix, and reacting a liquid rubber with said addition product to form a final product and curing said final product to form an interpenetrating polymer network in a matrix.

5. The process of claim 4, wherein the silicone oil is an oil selected form the group consisting of an alcohol modified silicone oil, an alcohol and alkoxy co-modified silicone oil, and an alkoxy modified silicone oil.

6. The process of claim 4, wherein the silicone resin has a molecular weight of about 1,000 to b 6,000.

7. The process of claim 4, wherein the silicone oil or resin and the coupling agent are present in an amount of about 80-100 parts by weight and about 5-20 parts by weight, respectively, and the reactive intermediate product and epoxy resin or phenolic resin are present in an amount of about 10-20 parts by weight and about 80-90 parts by weight, respectively.

8. The process of claim 4, wherein the total amount of the insoluble and infusible spherical particles and the matrix are present in an amount of about 5-20 parts by weight and about 100 parts by weight, respectively, said spherical particles having a particle size of about 0.1-0.5 μm.

9. The process of claim 4, wherein the liquid rubber is a chemical selected from the group consisting of a cis-type or trans-type butadiene rubber, acrylontrile-butadiene copolymerized rubber (ABR), and isoprene rubber, said liquid rubber having a molecular weight of about 2,000 to 5,000.

10. An epoxy molding composition useful as an encapsulant of semiconductor devices comprising a modified resin produced by the process of claim 1.

11. An epoxy molding composition useful as a encapsulant of semiconductor devices comprising a modified resin produced by the process of claim 4.

12. The process of claim 1, wherein the silicone oil or silicone resin is present in an amount of from about 80 to 100 parts by weight, the silane coupling agent is present in an amount of from about 5 to 20 parts by weight and the water medium is present in an amount from about 300 to 500 parts by weight.

13. The process of claim 4, wherein the silicone oil or silicone resin is present in an amount of from about 80 to 100 parts by weight, the silane coupling agent is present in an amount of from about 5 to 20 parts by weight and the water medium is present in an amount of from about 300 to 500 parts by weight.

* * * * *